United States Patent
Huang et al.

(10) Patent No.: US 9,761,507 B1
(45) Date of Patent: Sep. 12, 2017

(54) STACKED RECTIFIERS IN A PACKAGE

(71) Applicant: Diodes Incorporated, Plano, TX (US)

(72) Inventors: Pin-Hao Huang, New Taipei (TW); Tim C. Chen, Plano, TX (US); Yeng-Liang Lin, Allen, TX (US); Bau Shun Huang, New Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 15/092,671

(22) Filed: Apr. 7, 2016

(51) Int. Cl.
  *H01L 23/495* (2006.01)
  *H01L 25/04* (2014.01)
  *H01L 23/373* (2006.01)
  *H01L 23/31* (2006.01)
  *H01L 25/065* (2006.01)

(52) U.S. Cl.
  CPC ...... *H01L 23/3736* (2013.01); *H01L 23/3114* (2013.01); *H01L 23/495* (2013.01); *H01L 23/49537* (2013.01); *H01L 23/49575* (2013.01); *H01L 25/043* (2013.01); *H01L 25/0657* (2013.01); *H01L 2225/06548* (2013.01); *H01L 2225/06589* (2013.01)

(58) Field of Classification Search
  CPC ............. H01L 23/495; H01L 23/49537; H01L 23/49575; H01L 25/043; H01L 25/0756
  See application file for complete search history.

(56) References Cited

U.S. PATENT DOCUMENTS

| | | | | |
|---|---|---|---|---|
| 5,484,097 A | * | 1/1996 | Heuvel | H01L 23/49537 228/123.1 |
| 2005/0224945 A1 | * | 10/2005 | Saito | H01L 23/49575 257/686 |
| 2013/0285260 A1 | * | 10/2013 | Denison | H01L 25/07 257/777 |

* cited by examiner

*Primary Examiner* — Phat X Cao

(57) ABSTRACT

A rectifier package is provided, which comprises a first rectifier die having an anode and a cathode conductively bonded to a first conductive film on a first surface. The rectifier package also comprises a second rectifier die having an anode and a cathode conductively bonded to the first conductive film on a second surface, which is opposite to the first surface. The first conductive film is in contact with both anodes or both cathodes of the first rectifier die and the second rectifier die.

9 Claims, 3 Drawing Sheets

STACKED RECTIFIERS IN A PACKAGE

FIELD OF THE INVENTION

This invention in general relates to a package structure for rectifiers and, in particular, to stacked rectifiers in a package.

BACKGROUND

A rectifier for current rectification has been widely used in electronic devices. For rectifiers, current rating is an important index of rectification capability. To enhance current rating in an increasingly limited die area, multiple rectifier dies are stacked in a single package. For example, two rectifier dies may be connected electrically in parallel between an anode pin and cathode pin of a rectifier package to allow twice the amount of current to flow through the package. In some existing rectifier packages, each of the rectifier dies is mounted on a respective printed circuit board (PCB), and an additional PCB is placed over the stacked rectifier dies. Conductive traces on these PCBs provide conduction paths for current in the rectifier dies.

In forming the existing rectifier packages, the rectifier dies are put on their respective PCBs by a "pick and place" process and the dies face towards the same direction (e.g., facing upwardly or downwardly) with respect to the PCBs and the package.

SUMMARY

The inventor has observed that thermal management is becoming more critical to the development of stacked-die package. As the number of the stacked dies increases, more heat would he accumulated and significantly affect the performance of the rectifier package. The inventor has further observed several disadvantages in the existing rectifier package scheme. Firstly, the conduction paths associated with the dies exhibit discrepant thermal performances, in which one die generates more heat than the other and may become overheated. Furthermore, the electrically insulating material, such as FR4, generally used in PCB is a poor thermal conductor, and thus adversely impacts the performance of heat dissipation.

In addition, the conduction paths in the existing rectifier package are long and thus consume more power. Also, the excessive power consumption would cause more heat in the rectifier package.

The PCBs serve to support the rectifier dies of the package. However, the PCB may inevitably induce stray capacitance and/or stray inductance. Moreover, the thickness of the PCB accounts for an excessive thickness of the package. Therefore, the existing packaging scheme is not advantageous for improving heat dissipation and device miniaturization.

In order to overcome the above shortcomings, the inventor invents an improved stacked-die rectifier package. In an exemplary two-die package, the novel rectifier package replaces the PCB with a conductive film between the two dies and places the anodes (or cathodes) of the two dies on opposite surfaces of the conductive film, such that the two dies are disposed "face to face" or "back to back" in the package.

The present invention is provided to address the above-mentioned problems.

Firstly, since the two dies are placed "face to face" or "back to back," such arrangement improves the heat distribution between the conduction paths and lowers the risk that one die generates more heat than the other. In addition, such arrangement may reduce the length of a conduction path for a rectifier die at the anode or cathode side.

Secondly, the conductive film is made of metal, which is a better thermal conductive material than the PCB. Moreover, the conductive film eliminates the possibility of stray capacitance and stray inductance that would otherwise occur in the PCB structure.

Further, as far as the device geometry is concerned, the conductive film is made of metal and thus can be made relatively thinner than the summed thickness of the conductive traces plus the FR4-based PCB. The resultant package size can further shrink accordingly.

Several exemplary implementations of the invention are summarized below. Although only rectifier packages that embody this invention are explained in detail below, it will be apparent to those skilled in the art of modern packaging engineering that, following the teachings and the examples described in the present disclosure, this invention can be applied broadly. A skilled artisan can apply this invention in the designs and constructions of many different high-power applications by analyzing the component dies of the package to ascertain the power distribution among the dies and the respective layouts for the their conducting traces, identifying the relationships among related conduction paths, and determining whether some changes can be made for improvement. For example, a component die may be flipped or re-oriented such that the overall package can achieve an improved thermal performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In order to make the present disclosure completely comprehensible, detailed steps and structures are provided in the following description. Obviously, implementation of the present disclosure does not limit special details known by persons skilled in the art. In addition, known structures and steps are not described in details, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed embodiments, and is defined by the claims. The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment. References to "one embodiment," "an embodiment," "other embodiments" "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The term "conduction path" used throughout the present disclosure refers to as a path of current flowing through a routed conductor. The conduction path is measured along the routed conductor between two end points, where the end point may be a terminal of the rectifier package. Alternatively, the end point of the conduction path may be a component in the package, such as a rectifier die or a passive device. A typical example of the conduction path is a segment of a conductive trace connecting two elements or connecting one package pin to an internal element, or an inner trace connecting two terminals of the package.

The term "balanced" used throughout the present disclosure represents an extent of similarity or approximation among conduction paths in terms of thermal behavior. In some cases, the similar thermal behavior is accessed through the temperature measured on respective rectifier die, or the conductive trace per se. Thus, the chance that one die is burned down much earlier than the other may be effectively decreased. Two or more conduction paths may be regarded as more "balanced" in one arrangement than the other one for a more similar temperature trend. In some cases, better balanced conduction paths may result from a routing of better symmetry among traces. Alternatively, the better balancing may be achieved by making the effective resistance as close as possible among different conduction paths. Other approaches for achieving balanced conduction paths are also possible.

Figure 1A:
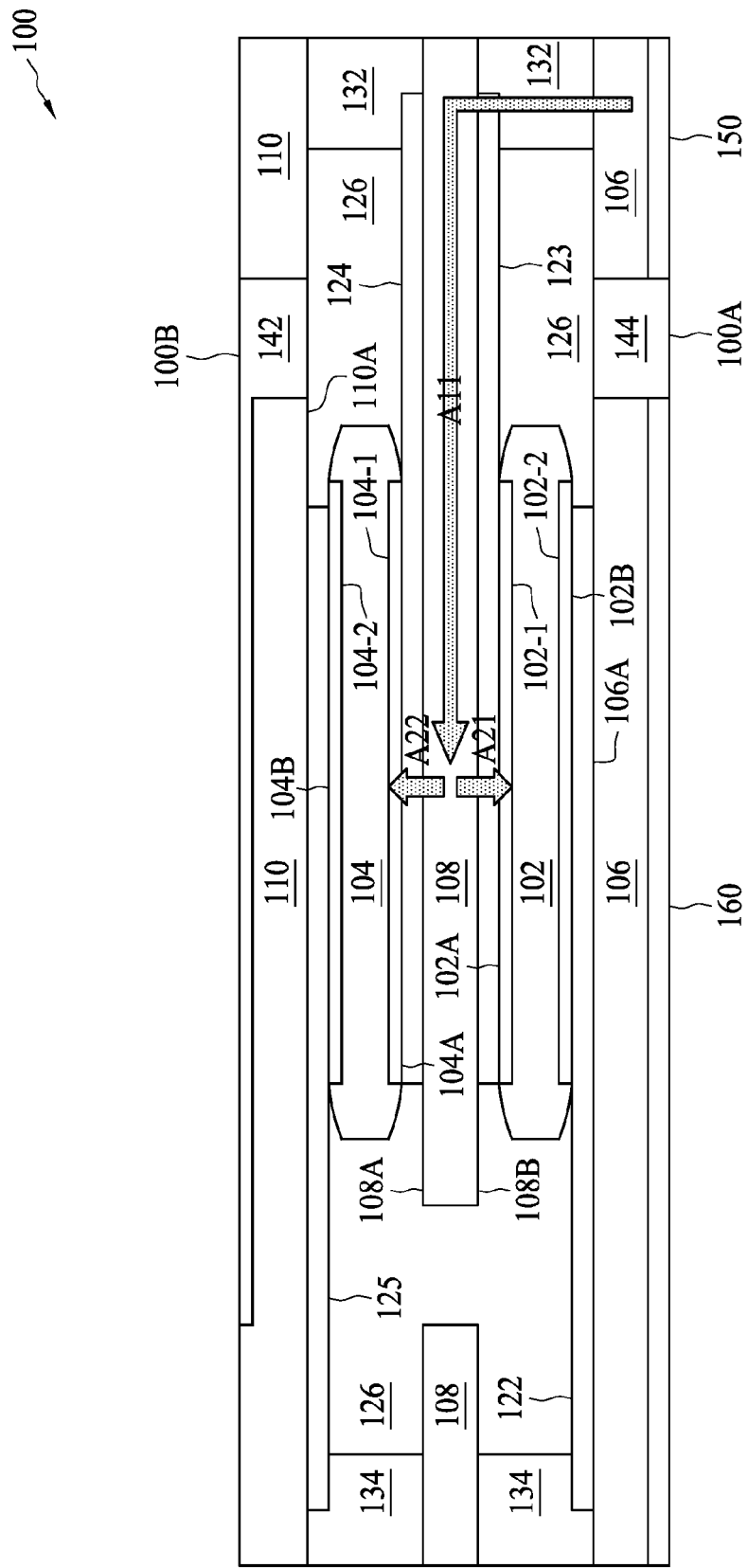
FIG. 1A is a block diagram of a rectifier package in accordance with an embodiment of the present invention.

FIG. 1 is a block diagram of a rectifier package 100 in accordance with an embodiment of the present invention. Referring to FIG. 1A, the rectifier package 100 comprises a first rectifier die 102, a second rectifier die 104, a first conductive film 106, a second conductive film 108, a third conductive film 110, conductive vias 132 and 134, conductive adhesives 122, 123, 124 and 125 and a molding compound 126.

The first rectifier die 102 and the second rectifier die 104 are configured to perform current rectification. The rectifier dies 102 and 104 may each comprise a semiconductor diode structure, and are arranged in a stack. The stacked-die rectifier package 100 can support a larger current rating than the individual rectifier die 102 or 104. In some cases, the rectifier package 100 may support a current rating of at least 15 amperes. Alternatively, the rectifier package 100 may support a current rating of at least 20 amperes.

The first rectifier die 102 is disposed between the first conductive film 106 and the second conductive film 108. The first rectifier die 102 comprises an anode 102-1 at a first surface 102A and a cathode 102-2 at a second surface 102B opposite to the first surface 102A. The first surface 102A and the second surface 102B of the first rectifier die 102 are electrically bonded to the second conductive film 108 and the first conductive film 106, respectively.

The second rectifier die 104 is disposed between the second conductive film 108 and the third conductive film 110. In addition, the second rectifier die 104 comprises an anode 104-1 at a first surface 104A and a cathode 104-2 at a second surface 104B opposite to the first surface 104A. The first surface 104A and the second surface 104B of the second rectifier die 104 are electrically bonded to the second conductive film 108 and the third conductive film 110, respectively.

The rectifier package 100 further comprises an anode pin 150 and a cathode pin 160, which serve as package terminals. A current may flow through each of the rectifiers 102 and 104 in parallel between the anode pin 150 and the cathode pin 160. The anode pin 150 may be part of the conductive film 106, or a conductive material electrically bonded thereto. Similarly, the cathode pin 160 may be part of the conductive film 106, or a conductive material electrically bonded thereto. The anode pin 150 and the cathode pin 160 may be disposed on a same side, such as a first side 100A, of the rectifier package 100. However, the anode pin 150 and the cathode pin 160 may also be disposed in different sides of the rectifier package 100.

Conductive films 106, 108, and 110 are configured to provide physical support for the rectifier die 102 or 104. In addition, the conductive films 106, 108, and 110 electrically couple an anode or cathode of the rectifiers 102 and 104 to the anode pin 150 or the cathode pin 160. The conductive film is usually made of metallic materials, such as copper, aluminum, silver or other suitable metal. In some cases, the conductive film may adopt a lead frame structure. The lead frame is usually made of metal, such as cooper, and comprises leads arranged in an outwardly radiating pattern.

The conductive vias 132 and 134 are formed as through-hole conductors in the conductive films 106, 108, and 110. The conductive vias 132 and 134 are configured to provide vertical conduction paths for the horizontally extending conductive films 106, 108, and 110. For example, the conductive via 132 is formed through the second conductive film 108 and in contact with the first and third conductive films 106 and 110. In addition, the conductive via 132 is configured to electrically couple the anode pin 150 with the anodes 102-1 and 104-1 through the second conductive film 108. Furthermore, the conductive via 134 is formed through the third conductive film 110 and in contact with the first and third conductive films 106 and 110. The conductive via 134 is configured to electrically couple the cathode pin 160 with the cathodes 102-2 and 104-2 through the first conductive film 106 and the third conductive film 110, respectively.

The conductive adhesives 122 to 125 are configured to provide conductive adhesion between the rectifier die 102 or 104 and associated conductive films. Specifically, the conductive adhesive 122 is dispensed between a first surface 106A of the first conductive film 106 and the second surface 102B of the first rectifier die 102, such that the cathode 102-2 of the first rectifier die 102 and the cathode pin 160 are conductively bonded through the first conductive film 106. Moreover, the conductive adhesive 123 is dispensed between the second surface 108B of the second conductive film 108 and the first surface 102A of the first rectifier die 102, such that the anode 102-1 of the first rectifier die 102 and the anode pin 150 are conductively bonded through the second conductive film 108.

Similarly, the conductive adhesive 124 is dispensed between the first surface 108A of the second conductive film 108 and the first surface 104A of the second rectifier die 104, such that the anode 104-1 of the second rectifier die 104 and the anode pin 150 are conductively bonded through the second conductive film 108. Moreover, the conductive adhesive 125 is dispensed between the second surface 104B of the second rectifier die 104 and a first surface 110A of the third conducive film 110, such that the cathode 104-2 of the second rectifier die 104 and the cathode pin 160 are conductively bonded through the third conductive film 110. The conductive adhesives 122 to 125 may comprise different types of solder pastes. An example of the conductive adhesive is silver solder paste.

The rectifier package 100 further includes a solder mask, or solder resist, for electrically isolating the anode pin 150 and the cathode pin 160 from one another. The solder mask 142 may be applied to the third conductive film 110 at the second side 100B of the rectifier package 100. Similarly, the solder mask 144 may be applied to the first conductive film 106 at the first side 100A of the rectifier package 100. The solder masks 142 and 144 may be selected from one of an epoxy liquid solder mask, a liquid photo-imageable solder mask and a dry film solder mask.

The molding compound 126 is used to encapsulate the package 100 and fill remaining space in the rectifier package 100. The molding compound 126 may benefit the package stability and robustness against contaminations, such as dust and moisture, or foreign stress. The molding compound 126 may comprise liquid epoxy.

As previously discussed, the anode 102-1 of the first rectifier die 102 is attached to the second surface 108B of the second conductive film 108. A first conduction path comprising subpaths A11 and A21 (shown in arrows, which indicate the direction of current) is established. Also, the anode 104-1 of the second rectifier die 104 is attached to the first surface 108A of the second conductive film 108. A second conduction path comprising subpaths A11 and A22 is established. As a result, a "common anode" configuration is obtained where the first and second conduction paths share the subpath A11. Such common-anode arrangement would make the conduction paths more balanced than the existing schemes. Moreover, the resistance discrepancy between the first and second conduction paths is effectively alleviated. As a result, the performance difference in consumed powers and resultant heat levels between the two rectifier dies 102 and 104 is significantly eliminated.

Although the embodiments of FIG. 1A illustrate a common-anode configuration, the invention is not limited to the common anode structure. For example, a "common cathode" structure also fall within the contemplated scope of the present invention. Based on the examples and teaching for the common-anode structure with reference to FIG. 1A, a person having ordinary skill in the art would readily develop a common-cathode structure with balanced conduction paths associated with the cathodes 102-1 and 104-2.

The proposed rectifier package 100 also holds other advantages. Since the conductive films 106 and 108, made of metallic materials, are used as underlying substrates of rectifier dies 102 and 104, the thermal dissipation performance of the rectifier package 100 is enhanced. In the existing scheme, FR4-based PCBs, disposed on the first side 100A and the second side 100B within the package 100, are thermally insulating. On the contrary, in the present invention, the first conductive film 106 and the third conductive film 110 are proximal to the first side 100A and the second side 100B, respectively. Thus, it is more advantageous for heat dissipation via the first side 100A and the second side 100B. Since the heat dissipation problem is significantly alleviated, the maximum current rating for the package 100 can be further increased.

Furthermore, in the existing approaches, the first rectifier die 102 and the second rectifier die 104 are bonded to a first PCB and a second PCB, respectively, by a "pick and place" procedure. Accordingly, the orientation of the anode 104-1 of the second rectifier die 104 facing toward the second side 100B is similar to that of anode 102-1 of the first rectifier die 102. As a result, a corresponding conduction path for such anodes would be routed through the conductive via 132, third conductive film 110 and conductive adhesive 125. However, in the present invention, given the similar "pick and place" procedure, the first rectifier die 102 and the second rectifier die 104 are bonded to the first conductive film 106 and the third conductive film 110, respectively. The second rectifier die 104 associated with the third conductive 110 is flipped such that the anode 104-1 of the second rectifier die 104, like the anode 102-1 of the first rectifier die 102, faces towards the second conductive film 108. The conduction path in the rectifier package 100 is routed through the conductive via 132, the second conductive film 108 and the conductive adhesive 124. It is obvious that the inventive conduction path for the second rectifier die 104 is not only more balanced but also shorter than the conduction path in the existing approaches. Effectively, the power consumption and heat generation is decreased in this regard.

Further, the geometry of the rectifier package 100 is reduced due to the usage of conductive films because the conductive films 106, 108 and 110 can be made much thinner than PCBs without adversely affecting conductive functions. In contrast, the conventional PCB, when reduced in its thickness, may fail to provide a robust support and reliable trace routing.

Another problem of using the PCB in the rectifier package is stray (parasitic) capacitance or stray inductance. Undesired capacitance or inductance may be present anywhere around circuits of the package and their electrical behaviors are difficult to predict. The situation would become worse if PCBs are utilized. Stray capacitance or stray inductance, that may otherwise be present in a PCB, can be mitigated through the use of conductive films.

In some applications, power supply devices, such as switching-type power supply, for providing boosted or step-down voltage levels may use rectifiers. When used in such devices, the rectifier may operate in alternating current of an alternating frequency called switching frequency. A range of the switching frequency may be higher than 10 kilohertz, such as 50 KHz. In some advanced applications, the switching frequency may be as high as several mega-hertz (MHz). The design consideration of rectifier package should take into account the impedance matching under the alternating current operation. However, the utilization of PCB in the rectifier package may complicate the tuning procedure of impedance matching. In the present invention, since the PCB is removed from the rectifier package 100, the issue of impedance mismatch is significantly relieved.

Based on the forgoing discussion, the performance of current rectification and thermal management are enhanced as compared to existing methods. The current rating is closely related to the heat distribution of the rectifier package 100. The existing method may not effectively provide a boosted current rating since the elevated temperature at some nodes may make the rectifier failed. In contrast, the present invention provides a superior thermal management scheme such that the current rating can be set higher without increasing the working temperature. In some cases, the current rating of the present example of two-die package 100 may be 30 amperes in terms of root mean square (RMS) current value. In alternative examples, the rectifier package 100 may operate at 40 amperes in terms of RMS value.

Figure 1B:
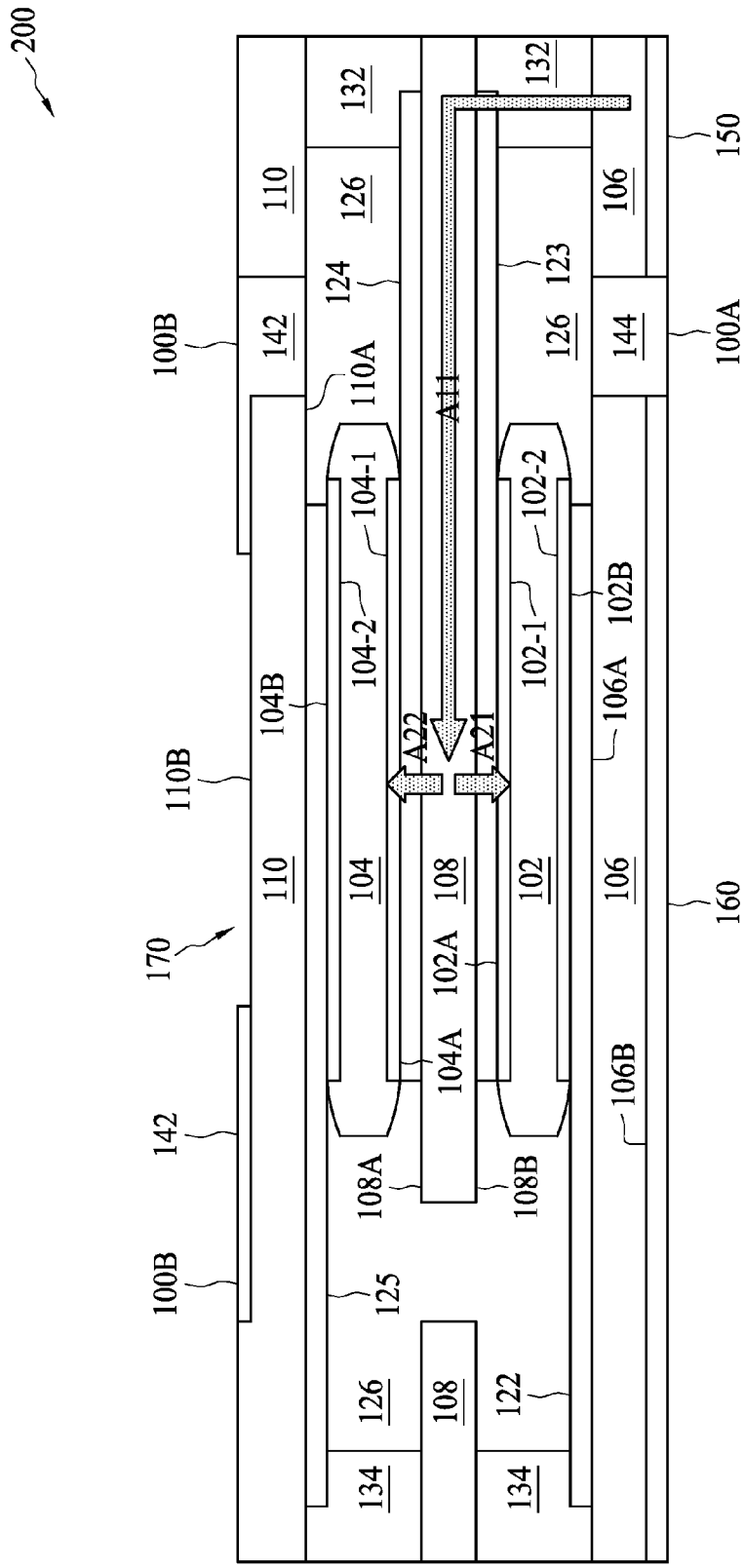
FIG. 1B is a block diagram of a rectifier package in accordance with another embodiment of the present invention.

FIG. 1B is a block diagram of a rectifier package 200 in accordance with another embodiment of the present invention.

Referring to FIG. 1B, the rectifier package 200 is similar to the rectifier package 100 described and illustrated with reference to FIG. 1A except that, for example, the rectifier package 200 further comprises an opening or recess 170 in the solder mask 142. The opening 170 is formed right above the second rectifier die 104. Alternatively, the opening 170 may be formed right above the cathode or anode of the second rectifier die 104.

The opening 170 may expose the third conductive film 110. In some applications, a heat conduction member, such as a heat sink, may be coupled to the rectifier package 100 on the second side 100B or the second surface 110B of the second rectifier die 104. Thus, the heat dissipation performance may be further improved.

In some existing rectifier packages, solder masks for electrical insulation are applied on PCBs. Since solder masks are not thermal conductive, they may hinder the stacked rectifier dies from heat dissipation. In the present example of FIG. 1B, the solder mask 144 is disposed adjacent to the first conductive film 106. In addition, the recess 170 exposes the third conductive film 110 to outside environments. As a result, large portions thermally conductive surfaces 110B and 106B are not covered by solder masks. The thermal condition performance may be enhanced accordingly.

A method of manufacturing the rectifier package briefly discussed below. In operation, a first substrate is provided. The first substrate may be a first conductive film, such as a lead frame. A first rectifier die is then bonded onto the first conductive film, using conductive adhesive such as solder paste. In a common anode structure, the cathode of the first rectifier die is bonded to the first conductive film.

Likewise, a second conductive film is provided. A second rectifier die is then bonded onto the second conductive film, using conductive adhesive. To form the common anode structure, the cathode of the second rectifier die is bonded to the second conductive film. Subsequently, a third conductive film is provided. The anode of the first rectifier die is attached to a surface of the third conductive film, while the anode of the second rectifier die is attached to an opposite surface of the third conductive film, using conductive adhesive. Asa result, the third conductive film is disposed between the first and second rectifier dies, and the anodes of the first and second rectifier dies are held "face to face."

Next, a molding compound is used to encapsulate the first rectifier die, the second rectifier die and the conductive films. The encapsulation may be performed by disposing the package in a mold case and injecting the molding compound into the package. The molding compound may comprise a liquid epoxy.

Vias are then formed at peripherals of the molded package through the first, second and third conductive films. The vias may be formed as drill-through holes. Subsequently, the vias are filled with conductive materials. The conductive material may comprise metal, such as copper, tungsten, silver and gold. The conductive vias are formed by any suitable processes, such as an electroplating operation. The conductive vias provide electrical paths connecting through the conductive films.

Figure 2:
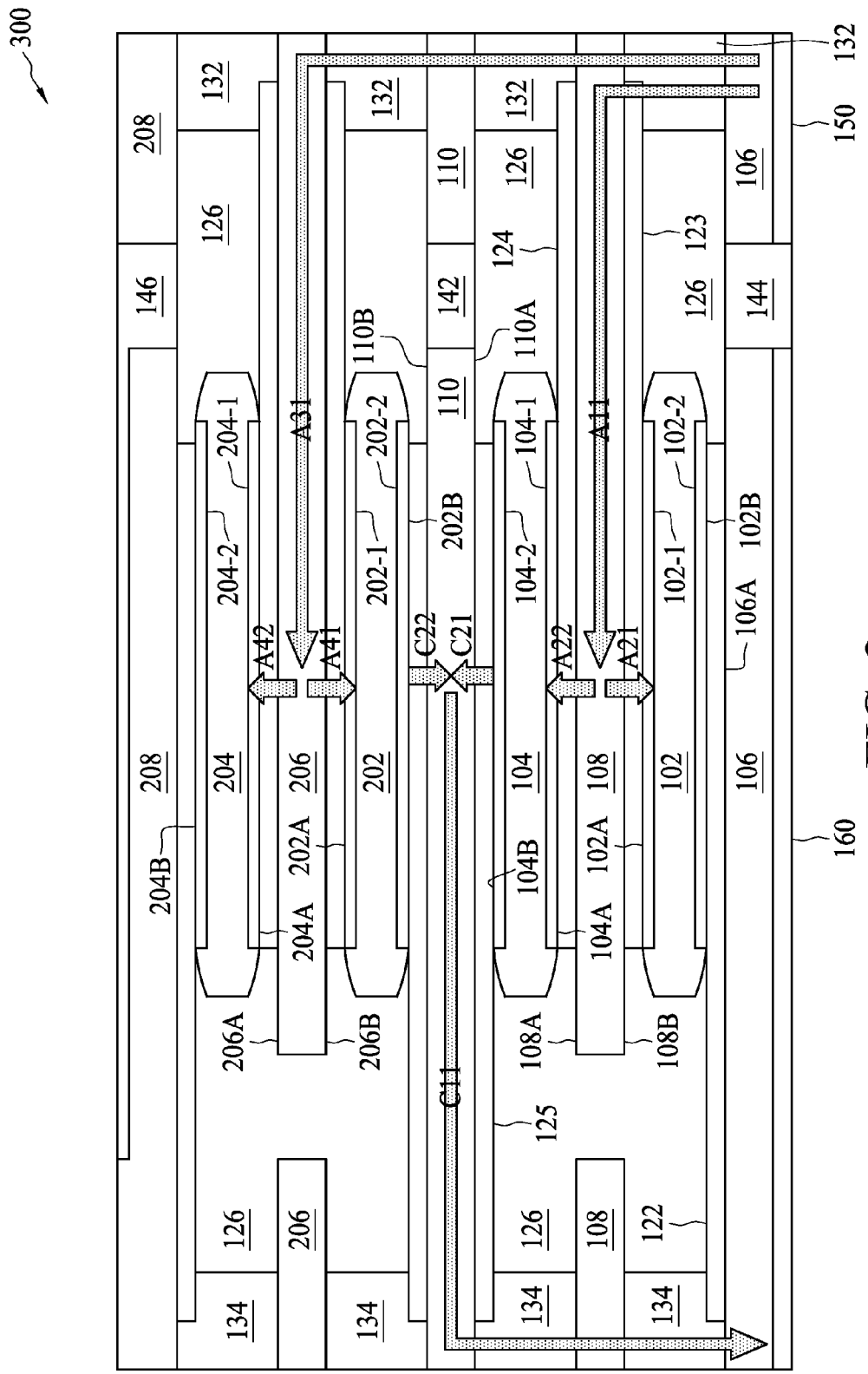
FIG. 2 is a block diagram of a rectifier package in accordance with yet another embodiment of the present invention.

FIG. 2 is a block diagram of a rectifier package 300 in accordance with yet another embodiment of the present invention. Referring to FIG. 2, the rectifier package 300 is similar to the rectifier package 100 described and illustrated with reference to FIG. 1A except that, for example, the rectifier package 300 further comprises a third rectifier die 202, a fourth rectifier die 204, a fourth conductive film 206 and a fifth conductive film 208. The rectifier package 300 can support twice the current rating of the rectifier package 100 due to the additional rectifiers 202 and 204.

The third rectifier die 202 is disposed between the third conductive film 206 and the fourth conductive film 208. The third rectifier die 202 comprises an anode 202-1 at a first surface 202A and a cathode 202-2 at a second surface 202B opposite to the first surface 202A.

The fourth rectifier die 204 is disposed between the fourth conductive film 206 and the fifth conductive film 208. In addition, the fourth rectifier die 204 comprises an anode 204-1 at a first surface 204A and a cathode 204-2 at a second surface 204B opposite to the first surface 204A.

The anode 202-1 is attached to the second surface 206B of the fourth conductive film 206. A third conduction path comprising subpaths A31 and A41 is established. Also, the anode 204-1 is attached to the first surface 206A of the fourth conductive film 206. A fourth conduction path comprising subpaths A31 and A42 is established. As a result, an additional "common anode" configuration with balanced conduction paths of the anodes 202-1 and 204-1 is established.

The third rectifier die 202 and the fourth rectifier die 204 are stacked in a similar fashion to the rectifier dies 102 and 104. The third rectifier die 202 and the fourth rectifier die 204 also form a "common-anode" configuration for both anodes thereof. In addition, a solder mask 146 is disposed on the fifth conductive film 208 in order to provide electrical isolation between the anode pin 150 and the cathode pin 160.

Furthermore, a "common-cathode" configuration is formed at the rectifier dies 104 and 202. Referring to FIG. 2, the cathode 104-2 is attached to the first surface 110A of the third conductive film 110. A corresponding conduction path comprising subpaths C11 and C21 is established. Also, the cathode 202-2 is attached to the second surface 110B of the third conductive film 110. A corresponding conduction path comprising subpaths C11 and C22 is established.

In a similar approach, more balanced conduction paths can be established along with the addition of stacked rectifier dies following a "face to face" or "back to back" configuration for two anodes or cathodes.

What is claimed is:

1. A rectifier package, comprising:
   a first rectifier die having an anode and a cathode conductively bonded to a first conductive film on a first surface thereof; and
   a second rectifier die having an anode and a cathode conductively bonded to the first conductive film on a second surface thereof which is opposite to the first surface,
   wherein the first conductive film is in contact with both anodes or both cathodes of the first rectifier die and the second rectifier die;
   an anode pin conductively coupled to both anodes of the first rectifier and the second rectifier, and a cathode pin conductively coupled to both cathodes of the first rectifier die and the second rectifier die; and
   a conductive via extending through the first conductive film and electrically coupling one of the anode pin and the cathode pin to the both anodes or the both cathodes of the first rectifier die and the second rectifier die.

2. The rectifier package according to claim 1, wherein the first conductive film is made of copper.

3. The rectifier package according to claim 1, wherein the first conductive film comprises a lead frame.

4. The rectifier package according to claim 1, further comprising a molding compound encapsulating the first rectifier, the second rectifier and the first conductive film.

5. The rectifier package according to claim 1, further comprising a solder mask configured to electrically isolate the anode pin from the cathode pin.

6. The rectifier package according to claim 1, wherein the anode pin and the cathode pin are disposed on a first side of the rectifier package.

7. The rectifier package according to claim 1, further comprising:
- a third rectifier die having an anode and a cathode conductively bonded to a second conductive film on a third surface thereof;
- a fourth rectifier die having an anode and a cathode conductively bonded to the second conductive film on a fourth surface thereof which is opposite to the third surface,
- wherein the second conductive film is in contact with both anodes or both cathodes of the third rectifier die and the four rectifier die.

8. A rectifier package according to claim 7, further comprising a third conductive film, wherein
- the second rectifier die is conductively bonded to a third conductive film on a fifth surface thereof,
- the third rectifier die is conductively bonded to the third conductive film on a sixth surface thereof which is opposite to the fifth surface,
- wherein the third conductive film is in contact with both anodes or both cathodes, not bonded to the first conductive film and the second conductive film, of the second rectifier die and the third rectifier die.

9. The rectifier package according to claim 1, wherein the rectifier package is configured to support an input current of at least 30 amperes.

* * * * *